United States Patent [19]

Omori et al.

[11] 4,213,840
[45] Jul. 22, 1980

[54] LOW-RESISTANCE, FINE-LINE SEMICONDUCTOR DEVICE AND THE METHOD FOR ITS MANUFACTURE

[75] Inventors: Masahiro Omori, Palo Alto; James N. Wholey, Saratoga; J. Ross Anderson, Sunnyvale, all of Calif.

[73] Assignee: Avantek, Inc., Santa Clara, Calif.

[21] Appl. No.: 959,792

[22] Filed: Nov. 13, 1978

[51] Int. Cl.$^2$ .................................... H01L 21/441
[52] U.S. Cl. ................... 204/192 C; 427/84; 427/89; 427/91; 29/578; 29/579; 29/591; 430/312
[58] Field of Search .......... 204/192 SP, 192 S, 192 C; 427/84, 89, 91, 90; 29/578, 579, 591; 156/661

[56] References Cited
U.S. PATENT DOCUMENTS

| | | | |
|---|---|---|---|
| 3,451,912 | 6/1969 | D'Heurle et al. | 204/192 |
| 3,590,478 | 7/1971 | Takehana | 29/578 |
| 3,604,107 | 9/1971 | Fassett | 29/571 |
| 3,669,730 | 6/1972 | Lepselter | 117/200 |
| 3,672,985 | 6/1972 | Nathanson et al. | 427/89 |
| 3,900,344 | 8/1975 | Magdo | 148/1.5 |
| 3,994,758 | 11/1976 | Ogawa et al. | 156/3 |
| 4,048,712 | 9/1977 | Buiatti | 29/571 |

OTHER PUBLICATIONS

A. K. Sinha, Metallization Scheme for n–GaAs Schottky Diodes Incorporating Sintered Contacts and a W Diffusion Barrier; Applied Physics Letters, vol. 26, No. 4 (2/1975) pp. 171-173.

P. A. Totta et al., Low Barrier Height Schottky Barrier Diodes by Metal RF Sputter Deposition Process; IBM Tech. Disc. Bulletin, vol. 20, No. 11B (4/1978) p. 4812.

*Primary Examiner*—John H. Mack
*Assistant Examiner*—William Leader
*Attorney, Agent, or Firm*—Limbach, Limbach & Sutton

[57] ABSTRACT

A method of fabricating gate electrodes on microwave field effect transistors is described. A first layer of photo-resist is deposited and photolithographically defined on top of a semiconductor material with openings in the photoresist, corresponding to the gate electrode. In one embodiment, when drain and source electrodes have been previously formed, additional openings in the first layer of photoresist are defined that approximately overlay the drain and source electrodes. A metal layer is then deposited on top of this structure. A second layer of photoresist is then deposited and photolithographically defined on top of the first metal layer, with larger openings which overlay the openings in the first layer of photoresist. The thickness of the gate electrode, and in one embodiment, the sections overlaying the drain and source electrodes, is then increased by plating gold into the openings in the second layer of photoresist.

20 Claims, 11 Drawing Figures

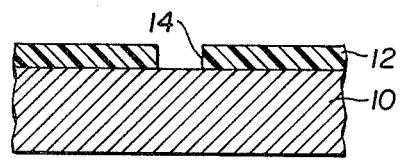
Fig.—1A.
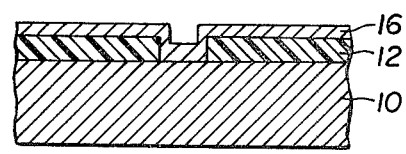
Fig.—1B.
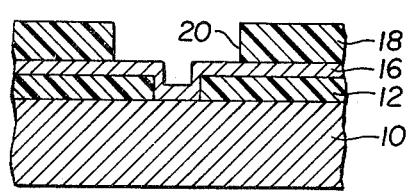
Fig.—1C.
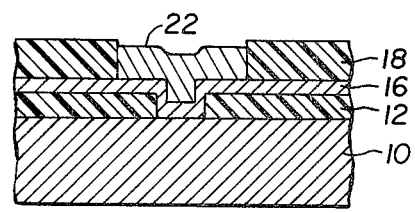
Fig.—1D.
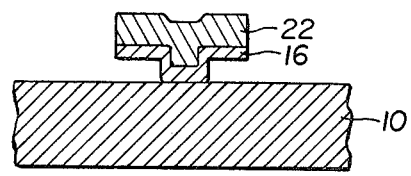
Fig.—1E.
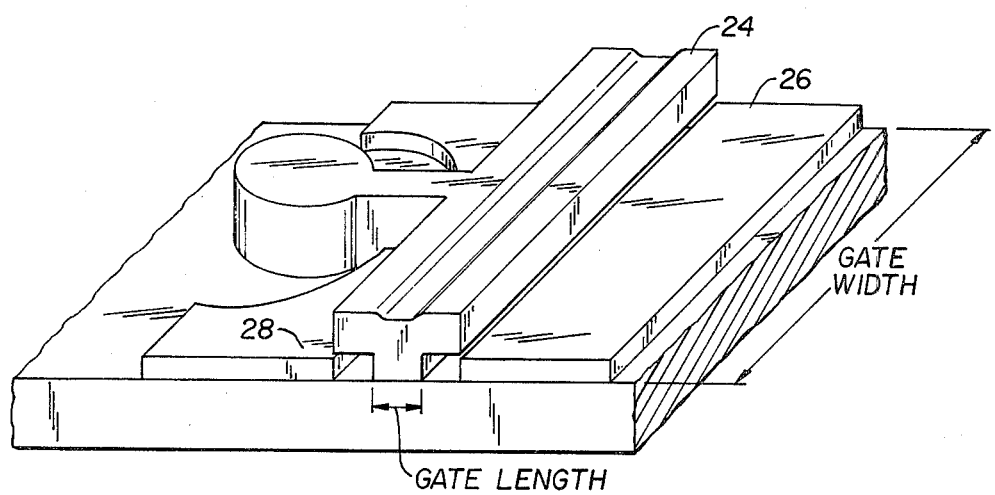
Fig.—2.

LOW-RESISTANCE, FINE-LINE SEMICONDUCTOR DEVICE AND THE METHOD FOR ITS MANUFACTURE

BACKGROUND OF THE INVENTION

This invention relates to a method of manufacturing a metal-semiconductor field effect transistor and in particular to the method of forming the gate electrode for such transistors.

Fabrication of the metal semiconductor field effect transistor (MESFET, or more commonly, a FET) involves forming drain, source, and gate electrodes on the surface of a semiconductor substrate. Ohmic contacts are generally used for the drain and source electrodes whereas a rectifying, Schottky barrier metal system is used for the gate electrode.

Current techniques used in fabricating gate electrodes attempt to achieve short gate lengths, low electrical resistance along the width of the gate, and the option to pre-etch the semiconductor before gate metallization is done. Also it is desirable that minimal stress be induced into the semiconductor by the gate metallization. Furthermore, it is desirable that the gate structure be compatible with self-aligning techniques to reduce gate-source and gate-drain electrode spacings. Current techniques used in fabricating gate electrodes may include some but do not include all of these features.

A common technique currently used involves lifting evaporated metal with a previously defined photoresist pattern off of the semiconductor surface, with only the gate electrode remaining. Here short gate lengths can be obtained and the semiconductor can be etched before metal deposition, but the electrical resistance along the gate width is severely limited by the thin layer of metal that can be lifted by such a process. One example of this technique is disclosed in U.S. Pat. No. 4,048,712, although the gate structure described in that patent is not particularly thin. In the structure described in the foregoing patent, self-alignment of the source and drain metallization is accomplished; however, this feature is generally not present in other prior art processes of this type.

Another common technique involves depositing a Schottky barrier metal over the entire semiconductor surface, photolithographically opening gate regions, electrolytically plating gold into these openings, and removing the photoresist and bare metal away from the area surrounding the gate electrode. This procedure, although providing short gate lengths and relatively low gate resistance, cannot be used with pre-etching techniques. Unless the gold is allowed to be plated over the top of the photoresist, a poorly defined procedure, this technique of gate formation also results in a structure which is not compatible with self-aligning procedures for the source and drain metallization.

SUMMARY OF THE INVENTION

The above and other disadvantages of prior art gate metallization for microwave FETs are overcome by the method of the present invention comprising the steps of depositing a first layer of photoresist material on the semiconductor surface, photolithographically defining a first area of the photoresist layer to be removed and removing the same to form a base area for the gate electrode and depositing a first metal layer on top of the remaining photoresist and the open base area. A second photoresist layer is next deposited on the first metal layer, and an area of the second photoresist layer is photolithographically defined and removed. This removed area overlies the base area to thereby create an enlarged opening in the second photoresist layer. Thereafter, a second metal layer is deposited in the enlarged opening of the second photoresist layer, on top of the first metal layer, to form a gate electrode. The configuration of the gate electrode as viewed in a cross-section taken in a plane which is perpendicular to the plane of the substrate surface and to the longest dimension of the electrode, forms a "Y" or "T" shape. The remainder of all of the first and second photoresist layers and all the first metal layer except that portion which underlies the second metal layer are thereafter removed.

In another embodiment of the method of the invention when the source and drain electrodes have been previously formed, the gate electrode and metal layers overlying the source and drain electrodes are formed simultaneously by the same sequence of steps; namely, overlying openings for the source and drain electrodes are also photolithographically defined in the first and second layers of photoresist along with the gate electrode. This procedure provides for greater mechanical support for the device along its top surface, lower parasitic resistance in the bonding pads, and easier attachment of bonding wires due to the increased metal thickness.

In the preferred embodiment of the invention the step of depositing the first metal layer includes depositing a layer of titanium-tungsten alloy followed by a layer of gold. This deposition is accomplished by low power RF sputtering. The titanium-tungsten alloy is constituted of 10% titanium by weight. The layer of titanium-tungsten alloy is deposited to a thickness of approximately 1000 angstroms. The subsequent layer of gold is deposited to a thickness of approximately 500 angstroms.

The second metal layer is gold and is deposited by electrolytic plating to a thickness of between 1 and 1½ microns.

In defining the opening in the first photoresist layer corresponding to the base area of the gate, the shortest dimension of the opening taken in a plane parallel to the substrate surface, that is corresponding to the gate length, is less than micron and the shortest corresponding dimension of the opening in the second photoresist layer is 1 to 2 microns. In this way a short gate length is achieved; however, because of the enlarged upper portion of the gate a low electrical resistance along the gate width is achieved.

The plated "Y" gate metallization for microwave FETs according to the invention incorporates many useful features to optimize the high frequency performance of such transistors. The semiconductor material below the gate can be etched before the metal is deposited. The gate length is similar to gate lengths obtainable with common lifted gate technologies, typically submicron, but, as mentioned above, the gate has a broad top extending over either side of the base stem and this provides low electrical resistance along the gate width. Also, this broad top makes for a self-aligned structure in the first embodiment of the invention since the drain and source evaporation will be shadowed close to the gate section. Metallization used for the plated Y gate is also compatible with very low stress damage in the semiconductor.

BRIEF DESCRIPTION OF THE DRAWINGS

FIGS. 1A-1E, inclusive, are cross-sectional illustrations of the sequence of fabrication steps of the gate electrode of an FET according to a first embodiment of the method of the invention, wherein FIG. 1A illustrates the first photolithographic step,
FIG. 1B shows the base metallization step,
FIG. 1C illustrates the second photolithographic step,
FIG. 1D illustrates a second layer of gold accomplished by electrolytic plating, and
FIG. 1E illustrates the resultant gate electrode after the photoresist and the excess metal have been removed;

FIG. 2 is a prospective view of a portion of the completed FET showing the final gate electrode, source and drain electrodes and the formation of a bonding pad adjacent to the gate;
and FIG. 3A and 3E, inclusive, are cross-sectional illustrations of the sequence of fabrication steps of the gate electrode of an FET according to a second embodiment of the method of the invention, wherein
FIG. 3A illustrates the first photolithographic step,
FIG. 3E illustrates the resultant gate, source and drain electrodes and overlying metal structures after the photoresist and the excess metal have been removed.

DETAILED DESCRIPTION OF THE PREFERRED EMBODIMENT

Figure 3A:
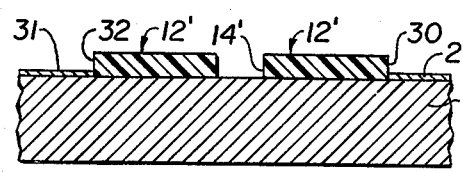
Figure 3B:
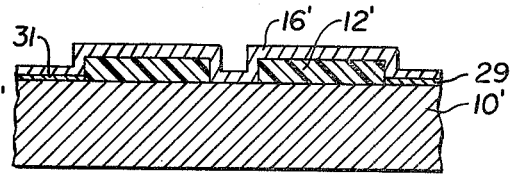
FIG. 3B shows the base metallization step.

Referring now more particularly to the FIGS. 1A-1E, a semiconductor wafer 10, such as gallium-arsenide (GaAs) is first prepared for formation of the gate electrode. This might include such procedures as an epitaxial growth of layers, selective mesa structures, and possibly, but not necessarily, drain and source electrode formation. A cross section of such a semiconductor wafer 10 is illustrated in FIG. 1A. A first layer 12 of positive photoresist is then deposited (spun) on the semiconductor wafer 10. By standard photolithographic techniques an area 14 of the photoresist, corresponding to the base area of gate electrode, is next selectively removed. The thickness of the layer 12 of photoresist is between 0.6 microns and 0.9 microns. The distance across the opening, taken in the plane of the figure, is approximately 0.5 microns. This distance corresponds to the gate length. It should be understood that the terms gate width and gate length are used in this application with their standard meaning. The term length is taken with respect to the direction of a first hypothetical line running from the source to the drain electrode whereas the term gate width is taken with respect to the direction of a hypothetical second line perpendicular to the first line. As mentioned above, it is desirable with microwave FETs to keep the gate length as short as possible while still having a low electrical resistance. After the gate opening 14 in the photoresist layer 12 has been made the semiconductor can now be etched, if desired, prior to the initial gate metallization.

Referring now more particularly to FIG. 1B, the wafer 10 is then metallized. A first metal layer 16, which is actually successive layers of titanium-tungsten alloy and gold, is deposited at a very low power to prevent excess heating and subsequent deformation of the photoresist layer 12, and in the case of sputter deposition to decrease radiational damage to the semiconductor surface at the gate electrode. The alloy is 10% by weight of titanium. The thickness of the titanium-tungsten alloy is approximately 1000 angstroms. The thickness of the subsequent gold layer is approximately 500 angstroms. The deposition may, for example, be done by RF diode sputtering at approximately 25 watts. Suitable equipment for carrying out this operation is manufactured by Material Research Corporation (MRC) or by Perkin-Elmer Ultek. Such equipment has a six inch diameter target, a pressure of nine microns of Argon, and a nominal target to substrate spacing of one and one-half inches. It will be understood by those skilled in the art that other suitable equipment may be utilized to carry out the same deposition provided it is done at a power which is sufficiently low to prevent such excess heating and deformation of the photoresist layer 12.

While a particularly advantageous alloy has been given by way of example for the layer 16 which forms the base of the Schottky barrier electrode, it will be apparent to those skilled in the art that numerous other suitable metals can be used, such as, for example, tungsten, molybdenum, platinum, palladium, aluminum, chromium and hafnium and some alloys of these metals.

Referring now more particularly to FIG. 1C, when the metallization layer 16 is completed, a second positive photoresist layer 18 is deposited on the wafer to a thickness of approximately 1.7 microns. A second, enlarged opening 20 is then photolithographically defined and removed. This opening has a shape and configuration similar to the base area opening 14 which was previously defined in the photoresist layer 12 but with slightly larger dimensions. The dimension taken in the direction of the gate length is between 1½ to 2 microns as opposed to the 0.5 micron gap of the first opening 14. The opening 20 is aligned with the base area 14 and effectively overlies it.

Referring now more particularly to FIG. 1D, the exposed metallized area in the opening 20 is next electrolytically plated with a layer of gold 22 to a thickness of between 1 and 1½ microns. The excess photoresist and metal are then removed, as illustrated in FIG. 1E, leaving the completed gate electrode. All of the layers of metal except those which filled the openings 14 and 20 are removed and all of the photoresist is removed. Adequate methods for this removal include successive soaks in a solvent solution such as acetone, for removal of the positive photoresist, electrolytic etching of the gold, and chemical ($H_2O_2$ based) removal of the titanium-tungsten alloy metallization 16.

As best viewed in FIG. 1E, the cross-sectional configuration of the gate electrode, taken in a plane which is perpendicular both to the planar surface of the substrate and to the width of the gate electrode, has a "Y" or "T" shape.

It has a relatively narrow stem portion which contacts the wafer and a larger or extended shoulder portion which overhangs the sides of the stem portion.

Referring now more particularly to FIG. 2, a prospective view of the completed gate electrode 24 is shown. If desired, the structure can be used to self-align an evaporated drain contact 26 and an evaporated source contact 28 since the region adjacent either side of the gate base is effectively shadowed by the upper area of the gate electrode 24.

Referring now more particularly to FIGS. 3A-3E, a modification of the method of the invention is illustrated. Elements which correspond to the embodiment depicted in FIGS. 1A through 1E have been given corresponding reference numerals primed. The modification of this embodiment over that described in reference to FIGS. 1A through 1E is basically that the source and drain electrodes must be formed previous to formation of the gate electrode and an overlay metal structure on the source and drain electrodes is created simultaneously with the gate electrode.

Ohmic contacts 29 and 31 for the drain and source electrodes are first formed by known techniques, e.g., by first applying a layer of photoresist (not shown), photolithographically defining and removing the drain and source openings in the photoresist, successively depositing various layers of appropriate metals, removing the photoresist and excess metal from the region surrounding the drain and source openings, and finally heating the layers until they alloy with each other and the semiconductor surface. When the primary layer 12' of positive photoresist is thereafter deposited on the semiconductor wafer 10' openings 30 and 32 on opposite sides of the opening 14' are created in the photoresist 12'. The additional openings, 30 and 32, overlay approximately the areas of the previously formed drain and source electrodes 29 and 31, respectively.

After the openings 14', 30 and 32 are made in the photoresist, the entire wafer surface is then metallized. A first metal layer 16', which is actually successive layers of titanium-tungsten alloy and gold, is deposited at a very low power to prevent excess heating and subsequent deformation of the photoresist layer 12', and in the case of sputter deposition, to decrease radiational damage to the semiconductor surface at the gate electrodes. As in the first embodiment of the invention, the alloy is 10% by weight of titanium. The thickness of the titanium-tungsten alloy is also approximately 1000 angstroms. The thickness of the subsequent gold layer is approximately 500 angstroms. The deposition of these layers is done in the same manner as was described in reference to the embodiment of FIGS. 1A through 1E.

Figure 3C:
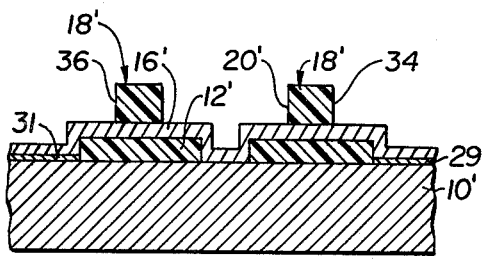
FIG. 3C illustrates the second photolithographic step.

Referring now more particularly to FIG. 3C, when the metallization layer 16' is completed, a second positive photoresist layer 18' is deposited on the wafer to a thickness of approximately 1.7 microns. In addition to the enlarged opening 20', two additional enlarged openings 34 and 36 are simultaneously made in the second photoresist layer. These openings 34 and 36 overlie the original openings 30 and 32 in the first photoresist layer 12', and correspond approximately to the previously formed drain and source electrodes 29 and 31.

Figure 3D:
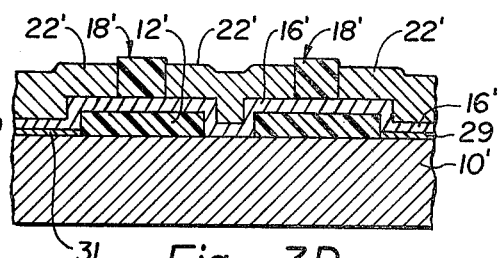
FIG. 3D illustrates a second layer of gold accomplished by electrolytic plating.
Figure 3E:
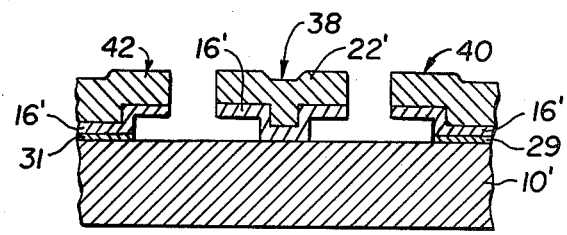

In FIG. 3D, the exposed metallized area in the openings 20', 34 and 36 is electrolytically plated with a layer of gold 22' to a thickness of between 1 and 1½ microns. The excess photoresist and metal are then removed, as illustrated in FIG. 3E, leaving the completed gate electrode 38, a drain electrode and overlay metal structure 40, and a source electrode and overlay metal structure 42. Adequate methods for this removal include successive soaks in a solvent solution such as acetone, for removal of the positive photoresist, electrolytic etching of the gold, and chemical ($H_2O_2$ based) removal of the titanium-tungsten alloy metallization 16'.

One of the advantages of this embodiment of the invention is that the drain and source electrodes and their overlay metal structures 40 and 42, together with the gate 38, provide a more mechanically sound protection for the upper surface of the semiconductor wafer 10' than the gate 38 by itself. This is because large areas of the finished transistor are almost equivalent in height. Additional advantages include reduced electrical resistance in the drain and source electrodes due to their relatively thick metal overlay structures. The increased gold thickness also enables easier and more reliable bonding of wires to the finished transistor.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

What is claimed is:

1. A method of fabricating a Schottky gate electrode on a field effect transistor between source and drain regions, comprising the steps of
    (a) depositing a first layer of photoresist material directly on a planar semiconductor surface,
    (b) photolithographically defining a first area of the first photoresist layer which area has its shortest dimension in the direction parallel to a hypothetical line extending from the source region to the drain region,
    (c) removing the first area to form a base area for the gate electrode,
    (d) depositing a first metal layer on top of the remaining first photoresist layer and the base area so that it is in electrical contact with the base area,
    (e) depositing a second photoresist layer on the first metal layer,
    (f) photolithographically defining an area of the second photoresist layer to be removed which area overshadows the base area, and removing this defined area to create an enlarged opening in the second photoresist layer, said opening being enlarged in the direction extending parallel to the hypothetical line running from the source region to the drain region, compared to the same dimension of the corresponding opening in the first photoresist layer,
    (g) depositing a second metal layer in the enlarged opening of the second photoresist layer to thereby increase the thickness of the gate electrode in a direction perpendicular to the plane of the semiconductor surface while simultaneously enlarging the gate electrode in the direction parallel to the hypothetical line extending from the source region to the drain regions, and
    (h) removing all of the remainder of the first and second photoresist layers and all of the first metal layer except that portion underlying the second metal layer.

2. A method of fabricating a Schottky gate electrode on a field effect transistor as recited in claim 1, wherein the step of depositing the first metal layer includes depositing a layer of metal selected from the group consisting of titanium, tungsten, molybdenum, platinum, palladium, aluminum, chromium and hafnium.

3. A method of fabricating a Schottky gate electrode on a field effect transistor as recited in claim 1, wherein the step of depositing a first metal layer includes depositing a layer of titanium-tungsten alloy followed by a layer of gold.

4. A method of fabricating a Schottky gate electrode on a field effect transistor as recited in claim 3, wherein the titanium-tungsten alloy is constituted of 10% of titanium by weight.

5. A method of fabricating a Schottky gate electrode on a field effect transistor as recited in claim 3, wherein the titanium-tungsten alloy layer is deposited to a thickness of approximately 1000 angstroms.

6. A method of fabricating a Schottky gate electrode on a field effect transistor as recited in claim 3, wherein the layer of gold is deposited to a thickness of approximately 500 angstroms.

7. A method of fabricating a Schottky gate electrode on a field effect transistor as recited in claim 1, wherein the first metal layer is deposited by RF sputtering at sufficiently low power to prevent excess heating and subsequent deformation of the first photoresist layer.

8. A method of fabricating a Schottky gate electrode on a field effect transistor as recited in claim 1, wherein the step of depositing the second layer comprises plating a layer of gold.

9. A method of fabricating a Schottky gate electrode on a field effect transistor as recited in claim 8, wherein the gold is plated to a thickness of between one to one-and-a-half microns.

10. A method of fabricating a Schottky gate electrode on a field effect transistor as recited in claim 1, wherein the shortest dimension of the base area taken in a plane parallel to the substrate surface, i.e., corresponding to the gate electrode length, is less than one micron and the shortest corresponding dimension of the enlarged opening in the second photoresist layer is one to two microns.

11. A method of fabricating a Schottky gate electrode on a field effect transistor as recited in claim 1, further comprising the step of depositing source and drain electrodes over the corresponding source and drain regions by evaporating metal onto the substrate surface while using the edges of the second metal layer of the gate electrode to shadow the substrate surface immediately adjacent to the base area of the gate electrode, whereby the source and drain electrodes are self-aligned.

12. A method of fabricating a gate electrode, and metal overlay structures for previously formed source and drain electrodes of a field effect transistor on a semiconductor surface comprising the steps of (a) depositing a first layer of photoresist material on the semiconductor surface, (b) photolithographically defining separate areas of the first photoresist layer to be removed and removing them to form openings in the first photoresist layer corresponding to the base area for the gate electrode, and overlay areas for the source and drain electrodes, the opening for the gate electrode having its shortest dimension in a direction extending parallel to a hypothetical line running from the source electrode to the drain electrode, (c) depositing a first metal layer on top of the remaining first photoresist layer, the base area, and the overlay areas to be in electrical contact therewith, (d) depositing a second photoresist layer on the first metal layer, (e) photolithographically defining separate areas of the second photoresist layer to be removed which areas overshadow the base area of the gate electrode and the overlay areas for the source and drain electrodes and removing these defined areas to create openings in the second photoresist layer, with the openings over these areas being enlarged in the direction extending parallel to a hypothetical line running from the source electrode to the drain electrode, compared to the same dimension of the corresponding openings in the first photoresist layer, (f) depositing a second metal layer in the openings of the second photoresist layer, and (g) removing all of the remainder of the first and second photoresist layers and all of the first metal layer except that portion underlying the second metal layer.

13. A method of fabricating a gate electrode on a semiconductor surface as recited in claim 12, wherein the step of depositing a first metal layer includes depositing a layer of titanium-tungsten alloy followed by a layer of gold.

14. A method of fabricating a gate electrode on a semiconductor surface as recited in claim 13, wherein the titanium-tungsten alloy is constituted of 10% of titanium by weight.

15. A method of fabricating a gate electrode on a semiconductor surface as recited in claim 13, wherein the titanium-tungsten alloy layer is deposited to a thickness of approximately 1000 angstroms.

16. A method of fabricating a gate electrode on a semiconductor surface as recited in claim 13, wherein the layer of gold is deposited to a thickness of approximately 500 angstroms.

17. A method of fabricating a gate electrode on a semiconductor surface as recited in claim 12, wherein the first metal layer is deposited by RF sputtering at sufficiently low power to prevent excess heating and subsequent deformation of the first photoresist layer.

18. A method of fabricating a gate electrode on a semiconductor surface as recited in claim 12, wherein the step of depositing the second layer comprises plating a layer of gold.

19. A method of fabricating a gate electrode on a semiconductor surface as recited in claim 18, wherein the gold is plated to a thickness of between one and one-and-a-half microns.

20. A method of fabricating a gate electrode on a semiconducting surface as recited in claim 12 wherein the step of depositing the first metal layer includes depositing a layer of metal selected from the group consisting of titanium, molybdenum, platinum, palladium, aluminum, chromium and hafnium.

* * * * *